United States Patent [19]

Gupta et al.

[11] Patent Number: 5,973,623
[45] Date of Patent: Oct. 26, 1999

[54] SOLID STATE CAPACITIVE SWITCH

[75] Inventors: Bhusan Gupta, Palo Alto; Alan Henry Kramer, Berkeley, both of Calif.

[73] Assignee: STMicroelectronics, Inc., Carrollton, Tex.

[21] Appl. No.: 08/957,972

[22] Filed: Oct. 21, 1997

[51] Int. Cl.[6] .................................................. H05B 37/02
[52] U.S. Cl. .............................. 341/33; 400/600; 307/116
[58] Field of Search ....................... 341/33, 26; 400/600; 382/124; 345/173, 174; 307/116; 361/181

[56] References Cited

U.S. PATENT DOCUMENTS

| | | | |
|---|---|---|---|
| 4,353,056 | 10/1982 | Tsikos | 340/146.3 |
| 4,939,382 | 7/1990 | Graoudis | 307/116 |
| 5,189,147 | 2/1993 | Caldwell | 341/26 |
| 5,325,442 | 6/1994 | Knapp | 382/4 |
| 5,796,355 | 8/1998 | Smigelski | 341/33 |
| 5,867,111 | 2/1999 | Caldwell | 341/33 |

OTHER PUBLICATIONS

Wolffenbuttel, et al., Integrated Tactile Imager with an Intrinsic Contour Detection Option, *Sensors and Actuators*, Jan./Feb. 1989, No. ½, pp. 141–153.

Young, et al., Novel Fingerprint Scanning Arrays Using Polysilicon TFT's of Glass and Polymer Substrates, *IEEE Electron Device Letters*, vol. 18, No. 1, Jan. 1997, pp. 19–20.

Tartagni, et al., A 390dpi Live Fingerprint Imager Based on Feedback Capacitive Sensing Scheme, *1997 IEEE International Solid–State Circuits Conference*, 1997.

Buchsbaum, Walter H., *Encyclopedia of Integrated Circuits Second Edition*, 1987, pp. 230–237.

*Primary Examiner*—Michael Horabik
*Assistant Examiner*—Albert K. Wong
*Attorney, Agent, or Firm*—Theodore E. Galanthay; Lisa K. Jorgenson

[57] ABSTRACT

A fingertip-operated solid state capacitance switch detects a capacity change that is induced by the physical contact of an ungrounded fingertip to an external dielectric surface of the solid state switch. The input and output of a solid state signal-inverting amplifier are respectively connected to two relatively large and ungrounded capacitor plates that are associated with, but electrically isolated from, the switch's external dielectric surface. An ungrounded fingertip forms a third capacitor plate on the switch's external surface. The solid state amplifier detects the presence of a fingertip on the switch's external surface by way of a change in capacitance within a compound, three plate, capacitor that includes the two ungrounded capacitor plates and the ungrounded fingertip that is resident on the switch's external surface. An automatic gain control circuit is provided to adjust the value of an amplifier reference voltage when the solid state switch is not operating, thereby allowing the solid state switch to adapt to changeable ambient conditions. A momentary switch and a toggle flip-flop latched switch are provided. A linear switch array having a movable control knob and a linear LED indicator array is provided. The momentary solid state switch is constructed to operate as a temporal code detector that detects a coded sequence of switch-taps and a coded time interval between adjacent switch-taps.

10 Claims, 8 Drawing Sheets

SOLID STATE CAPACITIVE SWITCH

BACKGROUND OF THE INVENTION

1. Field of the Invention

This invention relates to the field of electrical circuit switching, and more specifically, this invention relates to an object-operable, single pixel, capacitance type, solid state switch.

2. Description of the Related Art

U.S. patent application Ser. No. 08/799,548 by Marco Tartagni, filed Feb. 13, 1997, and entitled CAPACITIVE DISTANCE SENSOR is incorporated herein by reference. This application describes an Integrated Circuit (IC) capacitive distance sensor having a number of uses, including fingerprint acquisition. In this IC device, a portion of which is shown in FIGS. 1–3 of the present application, each individual cell 2 of a multi-cell array 3 includes a pair of flat armatures 23,24 that are spaced from each other in a horizontal plane to form a capacitor and to define a vertical distance "d" to be measured. Each cell 2 also includes the FIG. 2 amplifier arrangement whose input 16 is connected to one armature 24, and whose output 17 is connected to the other armature 23, such that the armature/capacitor comprises an amplifier negative feedback circuit 17,23,25,18, 24,16.

U.S. patent application Ser. No. 08/887,204 filed Jul. 2, 1997, and entitled SOLID STATE FINGERPRINT SENSOR PACKAGING APPARATUS AND METHOD (attorney docket number 97-B-036) shows a type of capacitive fingerprint sensing apparatus having a structure that, when modified, is usable in the present invention. This related patent application is incorporated herein by reference.

The present invention relates to a manual or an object-operable, solid state, capacitance switch. Capacitance-type sensors are generally known.

For example, the publication SENSORS AND ACTUATORS, January/February 1989, no.1/2, at pages 141–153, contains an article entitled INTEGRATED TACTILE IMAGER WITH AN INTRINSIC CONTOUR DETECTION OPTION that was presented at the Fourth International Conference on Solid-State Sensors and Actuators (Transducers '87), Tokyo, Japan, Jun. 2–5, 1987. This article describes an integrated capacitive tactile imaging sensor that comprises a multi-layer construction having a bottom ceramic support, a 9-row/9-column array of square aluminum electrodes that are contained on a silicon wafer integrated circuit, a flexible and isolating intermediate layer that is made up of natural rubber, a thin conductive rubber layer, and a top protective layer. In this device, capacitance depends upon local deformation of the natural rubber layer. The 81 individual aluminum electrodes of this device provide capacitive measurement of an indentation pattern within the natural rubber layer, this indentation being caused by a pressure distribution that acts on the top protective layer.

Capacitance type sensors that operate to sense the minutiae of a fingerprint are also known.

For example, the publication IEEE ELECTRON DEVICE LETTERS, VOL. 18, NO. 1, JANUARY 1997, pages 19–20, contains an article entitled NOVEL FINGERPRINT SCANNING ARRAYS USING POLYSILICON TFT'S OF GLASS AND POLYMER SUBSTRATES. This article describes a two-dimensional (2-D), 200×200, capacitance sensing array that is made up of 40,000 individual pixels. Each pixel of the array includes two Thin Film Transistors (TFTs) and a capacitor plate. Each array pixel resides at the intersection of an array-row and an array-column, and each array pixel is individually addressable by way of row-driver circuits and column-driver circuits.

Considering the two TFTs, hereinafter called TFT-A and TFT-B, that are associated with a given pixel, the drain electrodes of TFT-A and TFT-B are connected to the pixel's capacitor plate, the gate electrode and the source electrode of TFT-A are connected to a row-conductor that is associated with the pixel, the gate of TFT-B is connected to the following row-conductor, and the source of TFT-B is connected to a column-conductor that is associated with the pixel.

A thin (0.1 micrometer) silicon nitride insulator overlies the capacitor plate of each array pixel. When the ridge of a fingerprint lies directly over the capacitor plate, a capacitor is formed between the capacitor plate and the finger. This capacitor is charged when a row-pulse (8 to 10 VDC, and of 10 to 100 micro second duration) is applied to the pixel by way of the row-conductor that is associated with this pixel and TFT-A. This stored charge is thereafter transferred onto the pixel's column-conductor through TFT-B when a row-pulse is applied to the following row-electrode.

Also of interest is the publication 1997 IEEE INTERNATIONAL SOLID-STATE CIRCUITS CONFERENCE that contains and article beginning page 200 entitled A 390DPI LIVE FINGERPRINT IMAGER BASED ON FEEDBACK CAPACITIVE SENSING SCHEME. This article describes a single-chip, 200×200 element array, 2-metal digital CMOS technology, sensor that is based upon feedback capacitance sensing, and that operates to detect the electrical field variation that is induced by the finger's skin surface. In each element of the array, two horizontally spaced metal plates are separated from the overlying and adjacent portion of the finger's skin surface by passivation oxide. Since the distance between the skin and the sensor's surface identifies the presence of the fingerprint's ridges and valleys, an array of elements provides a complete fingerprint pattern.

In each element of the array, the two metal plates are respectively connected to the input and the output of a high-gain inverter, to thereby form a charge-integrator. In operation, the charge-integrator is first reset by shorting the input and output of the inverter. A fixed amount of charge is then sinked from the input, causing the output voltage to swing inversely proportional to a feedback capacitance value that is inversely proportional to the distance to the fingerprint's ridges and valleys. The array of cells, or sensors, thus provides the complete fingerprint pattern. The fingerprint image disappears when the finger is removed from the array.

U.S. Pat. No. 4,353,056, incorporated herein by reference, is of interest in that it relates to a capacitance type fingerprint sensor wherein a finger is pressed onto the sensor's surface in order to read the ridges and valleys of the fingerprint. The sensor-surface has a large number of capacitors of a small physical size associated therewith. Two sensors are described. In a first type of sensor, an electrical insulator carries a number of flexible and horizontally spaced curved metal electrodes, two adjacent metal electrodes of which comprise one capacitor. A protective insulating film overlies the electrical insulator, and when a finger is brought into physical contact with this protective insulating film, the metal electrodes are physically deformed, thereby selectively changing the capacitance of the large number of capacitors in accordance with the fingerprint's ridge/valley pattern. In a second type of sensor, the top surface of a rigid support carries a number of horizontally spaced and flat metal electrodes in a fixed position. Placed above the plane of the metal electrodes is the sequential arrangement of a flexible insulator, a flexible electrode, and a flexible protective membrane. A capacitor is formed between the top flexible electrode and each of the lower and fixed-position flat metal electrodes. When the end of a finger is brought into contact with the flexible membrane, the flexible electrode becomes wavy in accordance with the fingerprints' ridges/valleys pattern.

In addition, U.S. Pat. No. 5,325,442, incorporated herein by reference, relates to a capacitance-type fingerprint sensor having a sensing pad that comprises a planar array of row/column sensing elements having a pitch of about 100 micrometers. Each sensing element is located at the intersection of a row conductor and a column conductor, and in each sensing element, a sensing capacitor is made up of a planar sensing electrode that is spaced from a finger surface by way of an insulating film that overlies the sensing electrode. The plurality of sensing electrodes that make up the array are regularly spaced and re-equal size rectangles.

The sensing elements are fabricated using photolithographic processes, and each individual sensing element includes a Thin-Film-Transistor (TFT) in the form of a Field-Effect-Transistor (FET). Each FET gate is connected to a row conductor, each FET source is connected to a column conductor, and each FET drain is connected to a sensing electrode.

In one embodiment, each sensing element comprises a sensing capacitor that is formed between a sensing electrode and the finger. In another embodiment, each sensing element includes an electrically isolated and conducting pad the is physically engaged by the finger.

While prior devices as above described are generally useful for their limited intended use, a need remains in the art for an object operable solid state capacitance type switch having an improved construction, functionality and arrangement.

SUMMARY OF THE INVENTION

The present invention provides a low cost, fingertip-operated, solid state, capacitance type, amplifier switch having an improved construction and arrangement. The amplifier switch of the present invention operates on the principle of detecting a capacity change that is induced by the physical contact of an object such as an ungrounded fingertip with an external, or active, dielectric surface of the solid state amplifier switch.

While this invention will be described making reference to the detection of a fingertip on, or closely adjacent to, a dielectric upper surface of a solid state switch in accordance with this invention, the scope and spirit of this invention should not be limited thereto since switches in accordance with the invention are useful to detect the presence/absence of other objects; for example, a moveable portion of a machine.

One solid state amplifier/detector circuit is provided for each switch in accordance with this invention. The input and output of the solid state amplifier are respectively connected to two relatively large and ungrounded capacitor plates, or electrodes, that are associated with, but physically and electrically isolated from, the switch's external dielectric surface. A person's ungrounded fingertip forms a third capacitor plate on, or closely adjacent to, the switch's external surface. The solid state amplifier circuit detects the presence of a fingertip on the switch's external surface by way of a change in capacitance that is created within a compound, three electrode or three plate, capacitor that includes the two ungrounded capacitor plates and the ungrounded fingertip that is closely adjacent to, or resident on, the switch's external surface.

This compound capacitor is electrically connected to provide an ungrounded output-to-input negative feedback loop for a solid state signal-inverting amplifier, which amplifier operates to convert a sensed change in capacitance value into an output voltage or output current.

The solid state amplifier switch in accordance with this invention, can be quite small; for example, about 110 micro meters square, depending upon the IC rules and line widths of the fabrication technology that is employed. Of course, multiple and generally identical detector circuits can be placed physically and electrically in parallel in order to increase sensitivity and improve the robustness of switch detection.

In addition, and as a feature of the invention, an Automatic Gain Control (AGC) circuit may be integrated onto the solid state switch to periodically adjust the value of a reference voltage during quiescent times that the solid state switch is not operating, thereby allowing the solid state switch to automatically adapt to various ambient conditions by way of this voltage adjustment.

Advantages of the present invention include high sensitivity, small switch area, solid state reliability, low voltage operation, negligible power consumption, ability to operate in high/low temperature and/or high/low humidity environments, the ability to integrate the solid state switch of the present invention with other sensors, such as light sensors, to thereby provide a smart-switch, and the ability to integrate the solid state switch of the present invention with CMOS circuits, such as operational amplifiers, A/D converters, D/A converters, microprocessors, etc.

As a feature of the invention, the silicon portion of the solid state switch is coated by a thin film of electrically nonconducting plastic, thereby completely sealing this silicon portion from its physical environment.

In a momentary-operation embodiment of the invention, the solid state switch is provided with three external leads that comprise an output lead, a power lead, and a ground potential lead. In this embodiment, the solid state switch operates to short the output lead to ground when the switch is closed or turned on. This switching action can be a momentary switching action, or the switch can be maintained turned on until a subsequent finger touch is experienced. This latter function is implement by integrating a toggle flip-flop onto the switch's integrated circuit, to thereby provide a single-bit memory.

In another embodiment of the invention, the solid state switch is provided with four external leads; i.e., a contact-A lead, a contact-B lead, a power lead, and a ground potential lead. In this embodiment, contact-A lead and contact-B lead are opened/closed depending upon the operational state of the solid state switch. When the solid state switch includes a Diffused Metal Oxide Semiconductor (DMOS) power transistor that controls contact-A lead and contact-B lead, a conventional AC power line can be switched directly. As a feature of the invention, this embodiment includes a toggle flip-flop to provide a latched solid state switch that is closed by a first finger/object touch, and is opened by the next finger/object touch.

As an additional feature of the present invention, a linear switch array, comprising a plurality of solid state switches of the present invention, is associated with a slider control knob. Selective positioning of this control knob relative to the linear array of solid state switches results in operation of a selected number of the plurality of solid state switches, much in the nature of analog control. In addition, a linear array of Light Emitting Diodes (LEDs) is placed adjacent to the control knob, so as to visually indicate the current position of the slider. These LEDs can be discrete and distinct from the solid state switches, or the LEDs can be integrated into the switches, for example, using a CMOS/LED process.

As an additional feature of the invention, the above-described momentary solid state switch is modified to provide a temporal code detector that operates to detect a coded sequence of switch-taps, and a coded time interval between adjacent taps, and to then provide a code-satisfied output only when the correct number of taps, separated by the correct time intervals, has been received by the momentary solid state switch.

These and other objects, advantages and features of the present invention will be apparent to those of skill in the art upon reference to the following detailed description, which description makes reference to the drawing.

BRIEF DESCRIPTION OF THE DRAWING

FIG. 2 shows the electrical circuitry of a solid state amplifier, a modification of which is used in the present invention.

FIG. 4 shows a first momentary-switch embodiment of the invention having three external leads that comprise an output lead, a power lead, and a ground potential lead, this embodiment operating to short the output lead to ground when the switch is closed or turned on.

DESCRIPTION OF THE PREFERRED EMBODIMENT

Figure 1:
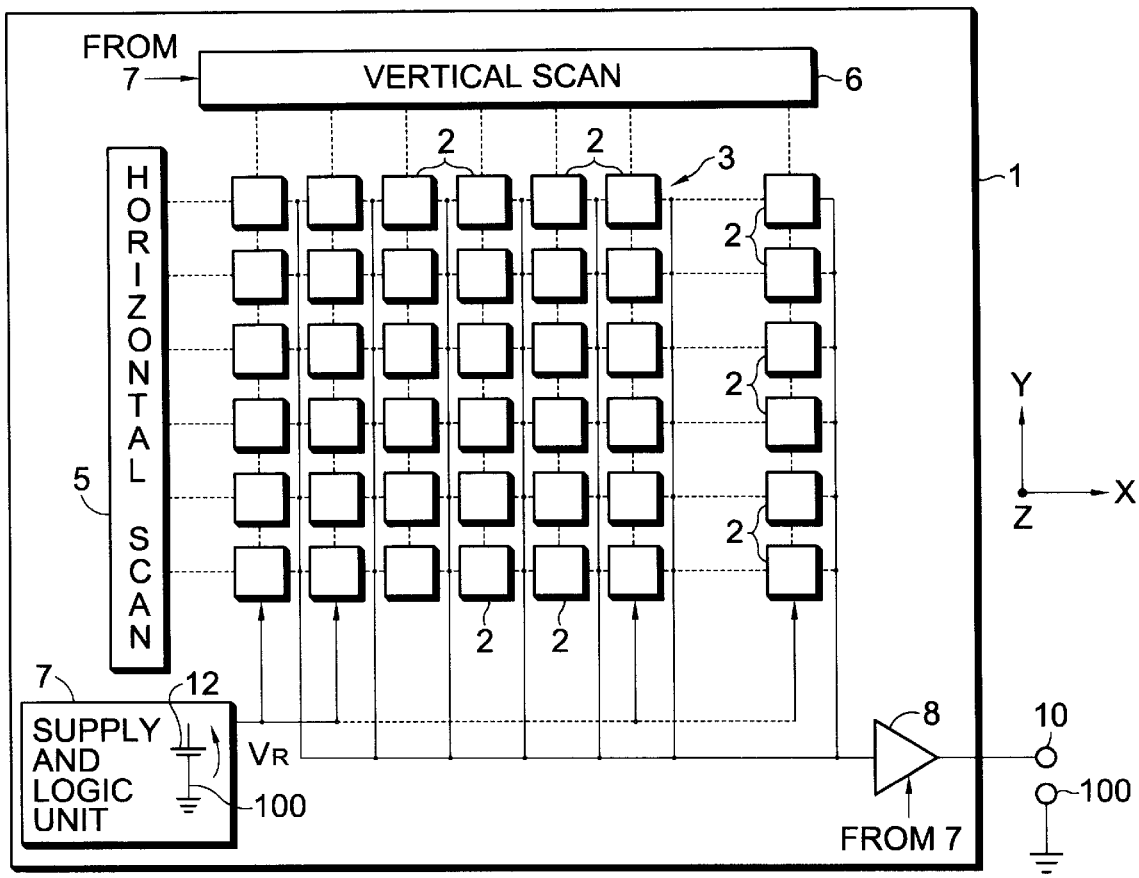
FIGS. 1, 2 and 3 are taken from the above-noted related application Ser. No. 08/799,548 by Marco Tartagni.
Figure 2:
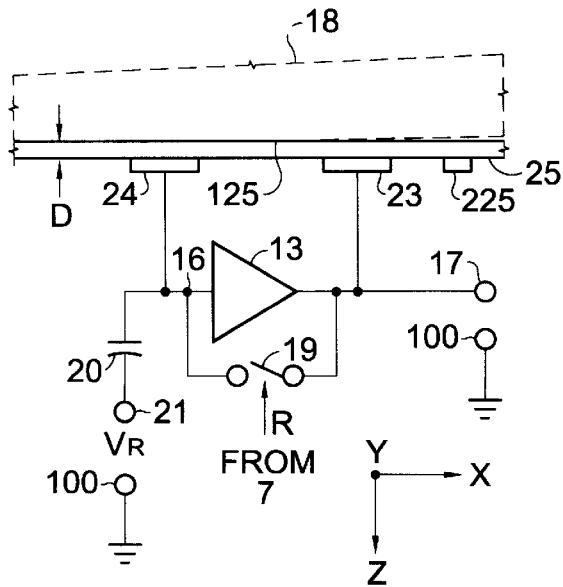
Figure 3:
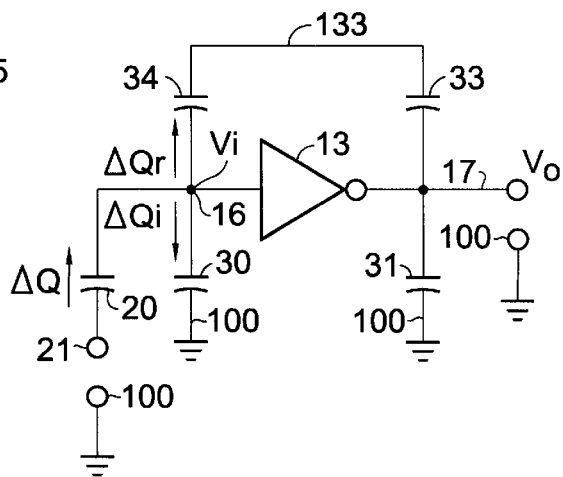

FIGS. 1, 2 and 3 are taken from the above-noted related application Ser. No. 08/799,548 by Marco Tartagni, and FIG. 2 thereof shows the electrical circuitry of a solid state amplifier, a modification of which is used in the present invention.

FIG. 1 is a top view of an IC device 1 that includes a generally planar, multiple pixel, multiple row/column, array 3 having a relatively large number of solid state capacitive sensor cells 2 that operate to provide an electrical output 10 that, in accordance with application Ser. No. 08/799,548, comprises a multiple pixel fingerprint pattern. As shown, FIG. 1 is taken in the X-Y plane.

Array 3 contains the number N of horizontal or X-direction extending rows of individual capacitance sensor cells 2, each row having the number M of individual sensor cells 2 therein, and array 3 contains the number M of vertically or Y-direction extending columns of individual capacitance sensor cells 2, each column having the number N of individual sensor cells 2 therein, wherein the numbers N and M are integers that may of may not be equal to each other. The number of individual picture elements, pixels, or cells 2 within array 3 is quite large, and equals the product of M×N. An example is 512×512 pixels or cells 2 within array 3, array 3 being of a physical size of about 20 mm to about 25 mm.

Each individual sensor cell 2 within array 3 is addressable by virtue the cell being physically located at the intersection of a row/column of array 3. The manner in which the individual sensor cells 2 of array 3 are addressed and read out in order to digitize a fingerprint pattern are well known to those of skill in the art.

IC device 1 includes a horizontal scanning stage, or network 6, and a vertical scanning stage or network 5 for sequentially interrogating or reading one cell 2 at a time, according to a predetermined scanning pattern. Preferably, stages 5 and 6 comprise shift registers, or decoders, that operate to interrogate the FIG. 2 outputs 17 of cells 2 sequentially.

IC device 1 also includes a supply/logic stage or network 7 that operates to supply the IC device components, including all cells 2, with the necessary operating voltages, and to control the sequence of steps that are necessary for operation of IC device 1. In particular, a DC voltage source 12 provides a DC reference voltage Vr that is reference to ground potential at 100. A buffer 8 is connected to the outputs 17 of all cells 2. Ground referenced output 10 of buffer 8 comprises the sequentially arranged output of IC device 1, the signal at output 10 being controlled by operation of scanning stages 5 and 6.

FIG. 2 schematically shows the amplifier circuitry of a single cell 2 of FIG. 1's array 3, all cells 2 being generally identical in construction and arrangement. Each cell 2 includes a low-power, signal inverting, amplifier 13.

In a fingerprint acquisition process in accordance with the above-noted related patent application Ser. No. 08/799,548 by Marco Tartagni, each amplifier 13 had an exemplary gain of from about 1000 to about 2000.

The solid state capacitive switch of the present invention can be used in a large number of operating environments. As a result, the gain of amplifiers such as amplifier 13 are tuned, or adjusted, such that the speed of operation of the solid state capacitive switch is compatible with the needs of the switch-application being served by the switch. For example, usually the required speed of switch operation is quite low, and as a result, amplifier gain can be considerably lower than the above noted range.

Terminal 21 comprise the input to the circuit of cell 2, and terminal 21 and input capacitor 20 connect to input 16 of solid state amplifier 13. Terminal 17 comprises the output of cell 2 and amplifier 13. Each cell 2 also includes two ungrounded X-Y planar armatures, or metal capacitor plates 23,24, that are of generally equal area and are horizontally, or X-direction spaced from each other within a common X-Y horizontal plane. A thin dielectric layer 25 covers capacitor plates 23,24, and the upper horizontal surface 125 of layer 25 provides an active array surface for physical contact by the skin surface of a finger 18 whose fingerprint is to be sensed or determined. Dielectric layer 25 may cover the entire face of the upper portion of IC device 1 that includes array 3 and its individual cells 2.

In use, a fingertip 18 is placed on the upper surface 125 of array 3's dielectric layer 25. Fingertip 18 thereby forms an ungrounded armature, or electrode, that vertically overlies and faces the top, X-Y planar, surfaces of capacitor plates 23,24. Fingertip 18 operates to define with plates 23,24 the first capacitor 34 of FIG. 3, and the second capacitor 33 of FIG. 3, which series connected compound capacitors 33,34 are connected in negative feedback fashion from amplifier output 17 to amplifier input 16.

Each cell 2 also includes a normally open start, reset, or control switch 19, preferably in the form of a Metal Oxide Semiconductor (MOS) switch. Switch 19 selectively and momentarily operates to short amplifier input 16 to amplifier output 17. Switch 19 is controlled by a control signal "R" that is provided by FIG. 1's supply and logic unit 7. At the start of a fingerprint acquisition operation, switches 19 of all array cells 2 are momentarily closed, and the voltage level at all cell inputs 21 is maintained at a constant magnitude. In this way, the input voltage of all cells 2 is brought to the same potential as the cell's output voltage.

Shortly thereafter, supply and logic unit 7 operates to open all reset switches 19, and to supply all cell inputs 21 with a step voltage that is equal in magnitude to reference voltage Vr. An electrical charge is now induced at each of the cell input capacitors 20, thus permitting the reading of the local and individual Z-direction cell distances "d" that exist between a cell's capacitor plates 23,24 and that cell's overlying fingertip ridge/valley surface 18.

Scanning stages 5,6 of FIG. 1 now operate to sequentially enable the reading, or interrogation, of the many cells 2 within array 3. In this way, buffer 8 operates to provide an output 10 in the form of a sequence of gray levels of voltage that comprise a three-dimensional readout and display of the fingertip ridge/valley surface 18 of the finger that is currently resident on the top surface 125 of array 3.

FIG. 3 is an equivalent circuit of the single cell circuit shown in FIG. 2. The input capacitance of amplifier 13 is shown at 30, the output capacitance of amplifier 13 is shown at 31, and the two above-mentioned series connected and touch-sensitive capacitors are shown at 33,34.

FIGS. 4–6 and 8 show embodiments of the present invention wherein structural elements that are common to above-described FIGS. 1–3 are identified by the use of common reference numerals. Each of the FIG. 4–6 and 8 solid state switch embodiments, as well as the arrangements of FIGS. 7, 9 and 10, may be constructed in accordance with the packaging scheme taught in the above-referenced application entitled SOLID STATE FINGERPRINT SENSOR PACKAGING APPARATUS AND METHOD.

In these FIG. 4–6 and 8 embodiments of the invention, dielectric-buried or dielectric-covered, capacitor plates 23,24 have an exemplary X-Y area as large as about 1 mm by 1 mm, or as small as about 50 micrometers by 50 micrometers. In either case, the Z-direction thickness of capacitor plates 23,24 is about 1 micrometer. However, this parameter varies based upon dimensions that are derived from the fabrication process that is used to produce the device.

With reference to FIGS. 4–6 and 8, each of the solid state switches 400,500,600 includes a cycling network 800 that operates in repeating cycles to sample the state of that switch's composite object-sensitive capacitor 33,34. An exemplary cycling rate is from about 1 to about 60 Hz.

In the operation of FIGS. 4–6 and 8, each cycle of cycling network 800 operates to first close momentarily close switch 19, to thereby short amplifier output 17 to amplifier input 16. Thereafter, reference voltage Vr is applied to capacitor 20, to thereby enable signal inverting amplifier 13 to sample the state of external surface 125 for the presence/absence of an object, such as fingertip 18, by way of the amplifier's output-to-input negative feedback circuit 33,34. Thereafter, reference voltage Vr is removed from capacitor 20, whereupon the cycle repeats.

Figure 5:
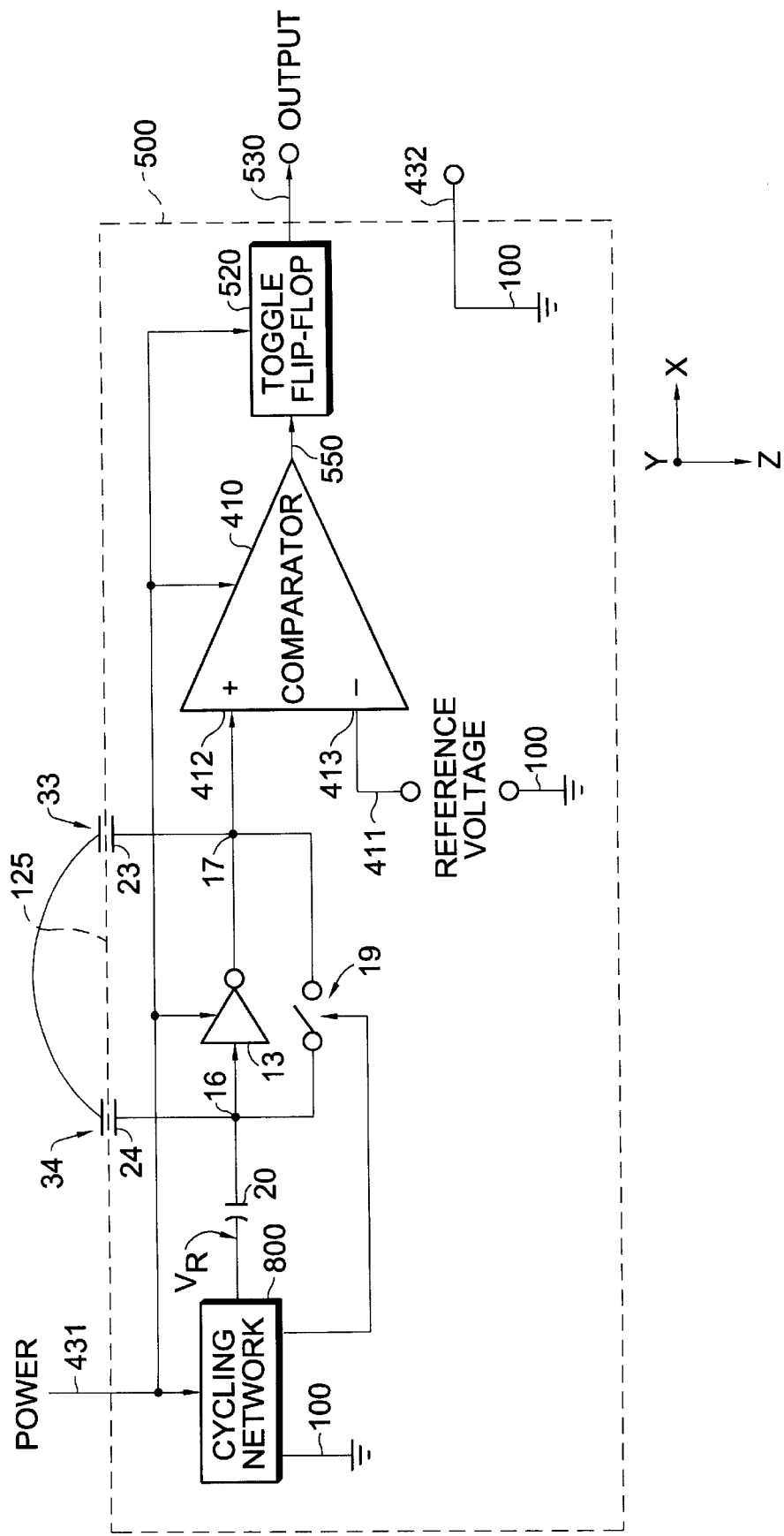
FIG. 5 shows a second latched-switch embodiment of the invention also having three external leads that comprise an output lead, a power lead, and a ground potential lead wherein the switch is maintained turned on until a subsequent finger touch is experienced by operation of a toggle flip-flop that is integrated onto the switch's IC to provide a single-bit of memory.
Figure 7:
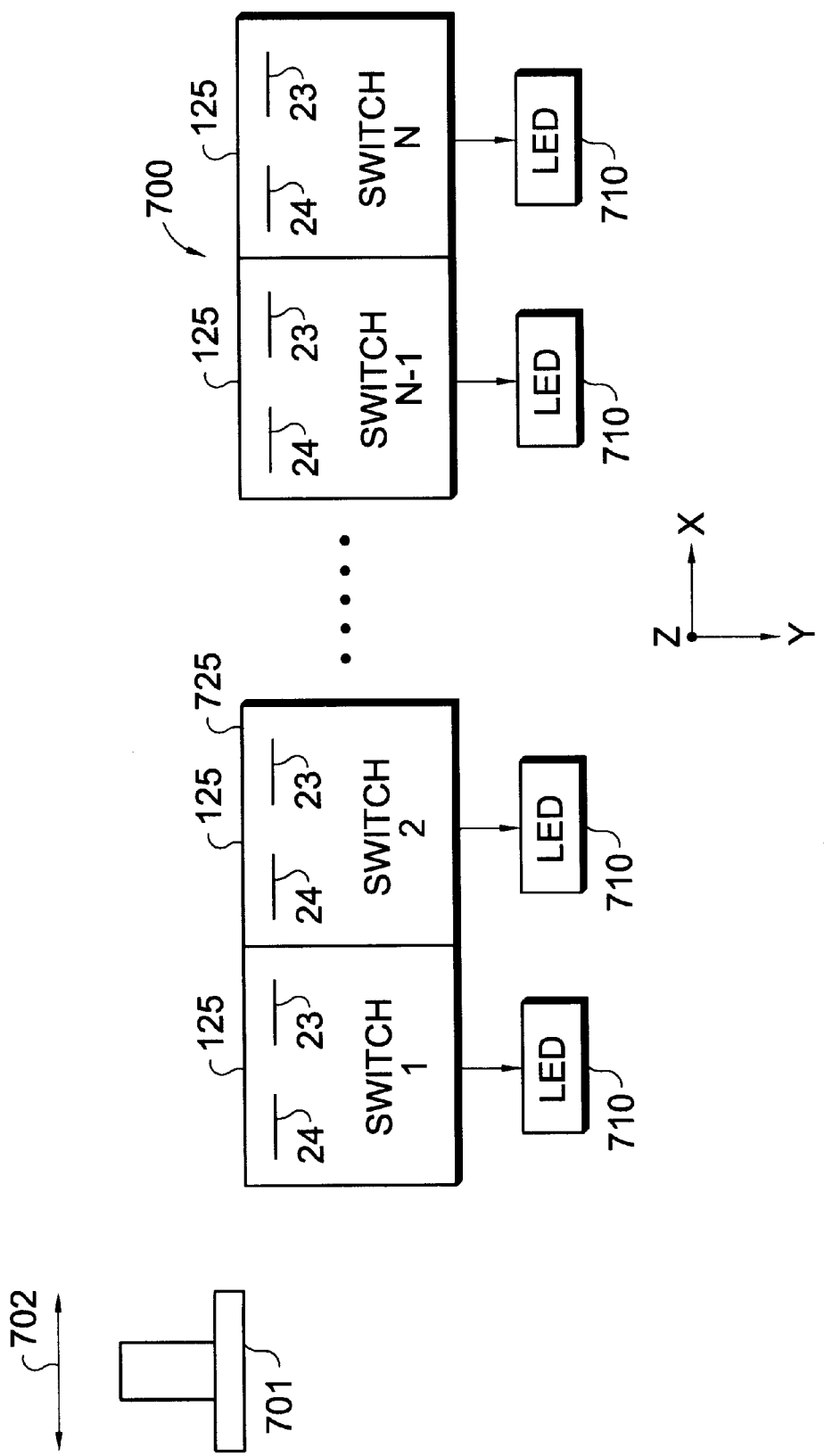
FIG. 7 shows an additional feature of the present invention wherein a linear array comprising the plurality N of solid state switches in accordance with FIG. 5 or 6, is associated with an automatically moved, or manually moved slider control knob, such that X-direction positioning of this control knob relative to the linear array results in operation of a selected number of the solid state switches, much in the nature of analog control. In this embodiment, a linear array of light emitting diodes, or LEDs, is placed adjacent to the slider so as to visually indicate the current position of the slider, wherein the LEDs can be discrete and distinct from the solid state switches, or wherein the LEDs can be integrated into the switches themselves; for example, using a CMOS/LED process.

With reference to FIG. 7 wherein a linear switch array 700 is made up of N solid state switches of the FIG. 5 latched-output type, each of the N switches includes the cycling network shown at 800 in FIG. 5. Each of these N cycling networks 800 operate as described above. In addition, the toggle flip-flop 520 (see FIG. 5) of all array switches that are downstream of the current X-direction position of slider 701 will be in a set state, slider movement being indicated by arrow 702. Thus, the set output of these toggle flip-flops 520 is used to indicate the current position of slider 701, and to effect any one of a number of control outputs that may be associated with the position of slider 701.

It should be noted that in FIGS. 4–6 and 8, a dotted line rectangle encircles the silicon portion of switches 400,500, 600 that carries the internal switch circuitry. These silicon portions may include the improvements that are described in above-noted and related application entitled SOLID STATE FINGERPRINT SENSOR PACKAGING APPARATUS AND METHOD.

Again, with reference to FIGS. 4–6 and 8, each of the solid state switches 400,500,600 includes a signal comparator network 410 that operates to compare DC signal output 17 of amplifier 13 to a ground-referenced source of DC reference voltage 41 1, it being remembered that the magnitude of amplifier output 17 is indicative of the presence/absence of an ungrounded fingertip 18 on surface 125, generally vertically over the location of capacitor plates 23,24. That is, the variable magnitude of object-sensitive output signal 17 is compared to the constant magnitude of reference voltage 411.

As shown, but without limitation thereto, DC amplifier output 17 is connected to the non-inverting input 412 of comparator network 410, whereas DC reference voltage 411 is connected to the inverting input 413 of comparator network 410.

Figure 4:
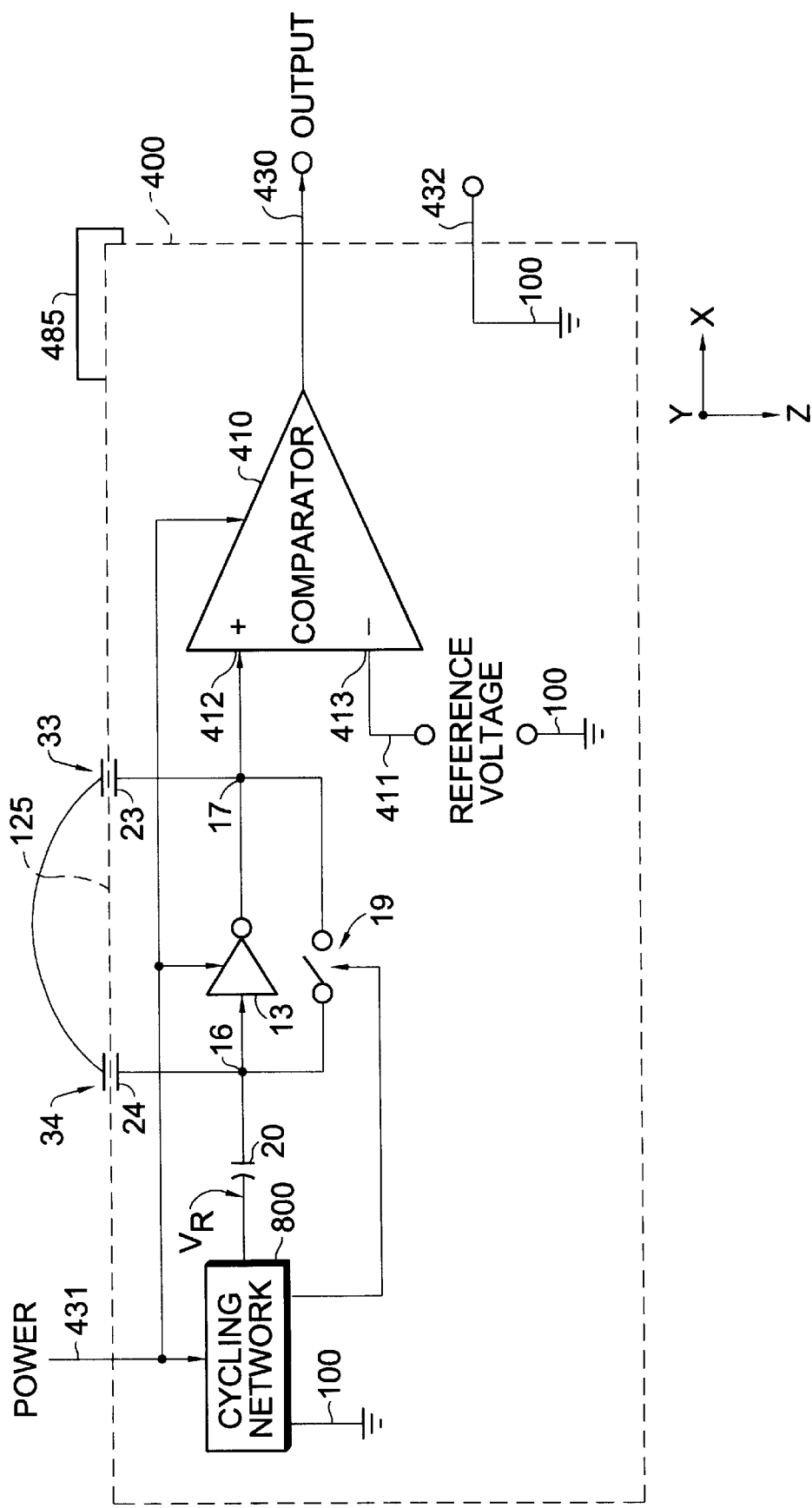

The FIG. 4 embodiment of the invention provides a solid state switch 400 having three external leads, wires, or electrical conductors, i.e. an output lead 430, a power supply lead 431, and a ground potential lead 432. In operation, FIG. 4 operates to short output lead 430 to ground 432 when switch 400 is closed or turned on by the presence of fingertip 18 on surface 125, and switch 400 remains in this closed/on state only so long a fingertip 18 remains on surface 125.

As a feature of this invention, the silicon portion of any solid state switch in accordance with this invention, may be coated with a thin film of electrically nonconducting plastic as shown at 485 of FIG. 4, thereby completely sealing the circuit-carrying silicon portion from its surrounding physical environment.

FIG. 5 is similar to FIG. 4, with the exception that a toggle flip-flop 520 has been added to solid state switch 500 to receive the output 550 of comparator network 410 as an input thereto.

As used herein, the term toggle-flip-flop, also know as a flip-flop, a bistable trigger, or a toggle, is intended to mean virtually any electronic switching device that has two stable states, wherein a first input event places the switching device in its first stable state, wherein a second input event places the switching device in its second stable state, etc. For example see the ENCYCLOPEDIA OF INTEGRATED CIRCUITS, *Prentice Hall, Second Edition,* copyright 1987, at pages 230–237.

Again, solid state switch 500 has three external leads, wires, or electrical conductors, i.e. an output lead 530, a power supply lead 431, and a ground potential lead 432. In operation, FIG. 5's amplifier output 550 operates to set flip-flop 520 to a first of its two stable states when the presence of a fingertip 18 is detected on surface 125. By way of a nonlimiting example, in this condition of flip-flop 520 output lead 530 is shorted to ground 432. When fingertip 18 is subsequently removed from surface 125, flip-flop 520 remains in this first stable state, and output lead 530 remains shorted to ground 432. That is, toggle flip-flop 520 has been integrated onto the integrated circuit of switch 500 to provide a single-bit of output memory. When fingertip 18 is next placed on surface 125, flip-flop 520 is reset.

Figure 6:
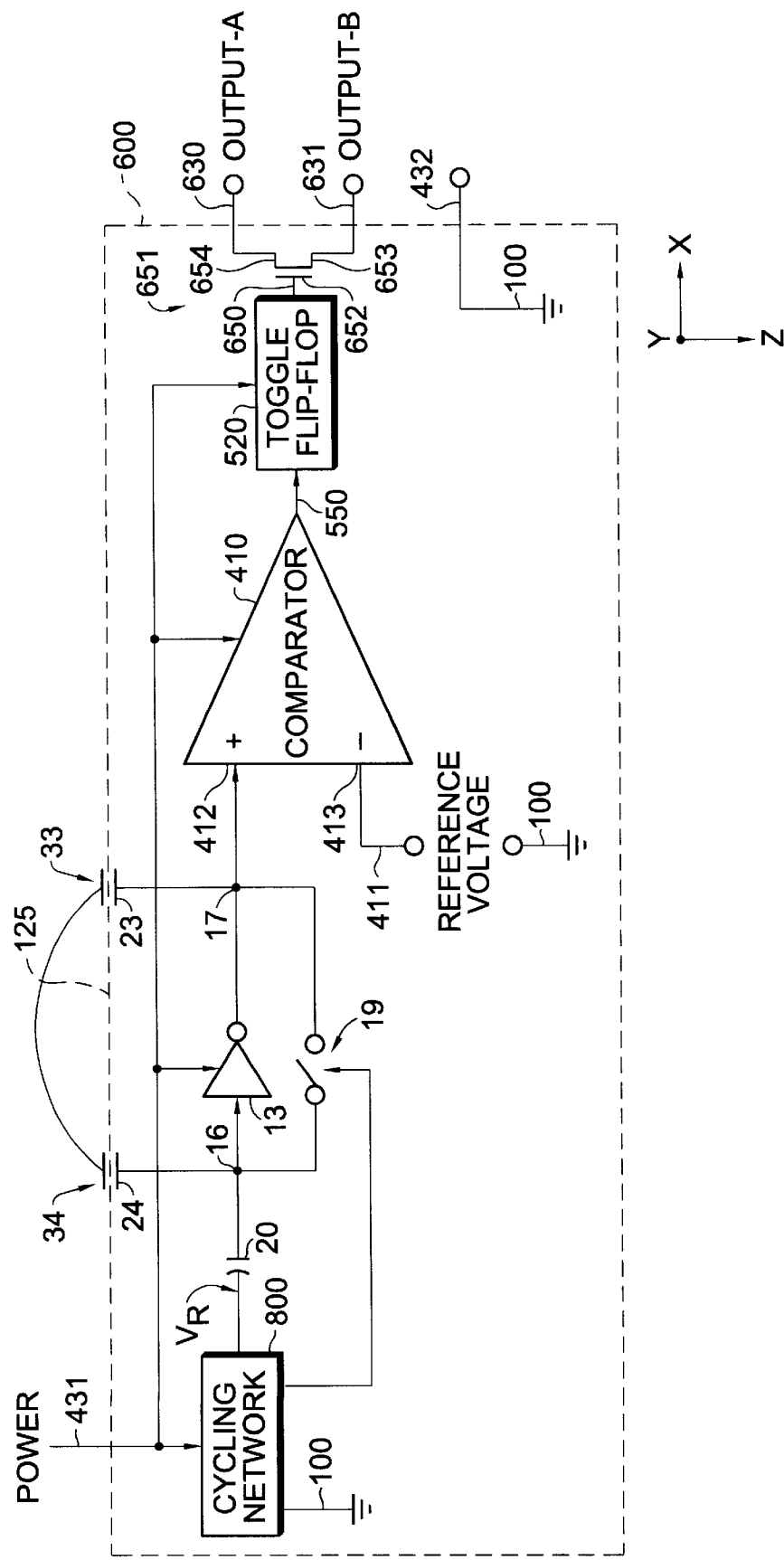
FIG. 6 shows a third embodiment of the invention wherein a DMOS solid state output power transistor is provided, so that the FIG. 6 switch has four external leads, wires or electrical conductors, i.e. an output contact-A lead, an output contact-B lead, a power lead, and a ground potential lead, wherein a circuit extending between contact-A lead and contact-B lead is opened/closed depending upon the on/off operational state of the solid state switch, and wherein the switch's DMOS power transistor controls contact-A lead and contact-B lead such that a conventional AC power line can be switched directly by opening/closing the power transistor circuit that extends between leads A and B.

FIG. 6 is similar to FIG. 5, with the exception that a DMOS solid state output power transistor 651 is provided.

Gate electrode 652 of power transistor 651 is connected to receive memory-output 650 of toggle flip-flop 520, and the source and drain 653,654 of power transistor 651 are respectively connected to switch a high voltage line 630,631.

Switch 600 of FIG. 6 in accordance with this embodiment of the invention, has four external leads, wires or electrical conductors, i.e. an output contact-A lead 630, an output contact-B lead 631, a power supply lead 431, and a ground potential lead 432. In this embodiment of the invention, the source/drain internal transistor circuit that interconnects contact-A lead 630 and contact-B lead 631 is opened/closed depending upon the bistable operational state of toggle flip-flop 520, as was above described relative to FIG. 5. Use of DMOS power transistor 651 enables switch 600 to directly switch a conventional AC power line such as 630,631 by opening/closing the source/drain connection of power transistor 651.

With reference to FIG. 7, this figure shows a linear switch array 770 having the plurality N of solid state switches in accordance with the FIG. 5 or 6 construction.

The active surface 125 of each of the N switches is associated with an automatically movable, or a manually movable, slider-type control knob 701. Knob 701 is shown in its left-most inactive position in FIG. 7, and knob 701 is adapted for movement back and fourth in the X-direction, as indicated by arrow 702. The X-direction position of control knob 701 relative to linear switch array 770 results in operation of a selected number of the N switches that are located to the left of knob 701, much in the nature of analog control.

As will be recalled from the above description of FIGS. 5 and 6, in FIG. 7 the toggle flip-flop 520 of the one switch that is currently associated with knob 701, for example switch-4, as well as toggle flip-flops 520 of all of the upstream switches, in this example switch-1, switch-2 and switch-3, are in a set state. In FIG. 7, each switch flip-flop 520 is connected to energize a Light Emitting Diode (LED) 710 so long as the flip-flop is in a set condition.

In this way, the linear array 750 of N LEDs 710, which are placed adjacent to knob 701, operates to visually indicate the current position of the knob 701. When knob 701 is moved back to the right in FIG. 7, switch flop-flops 520 are reset in accordance with the extent of this movement, and LEDs 710 are deenergized in a corresponding manner.

LEDs 710 can be discrete and distinct from the solid state switches, or LEDs 710 can be integrated into the switches themselves, for example, using a CMOS/LED process.

Figure 8:
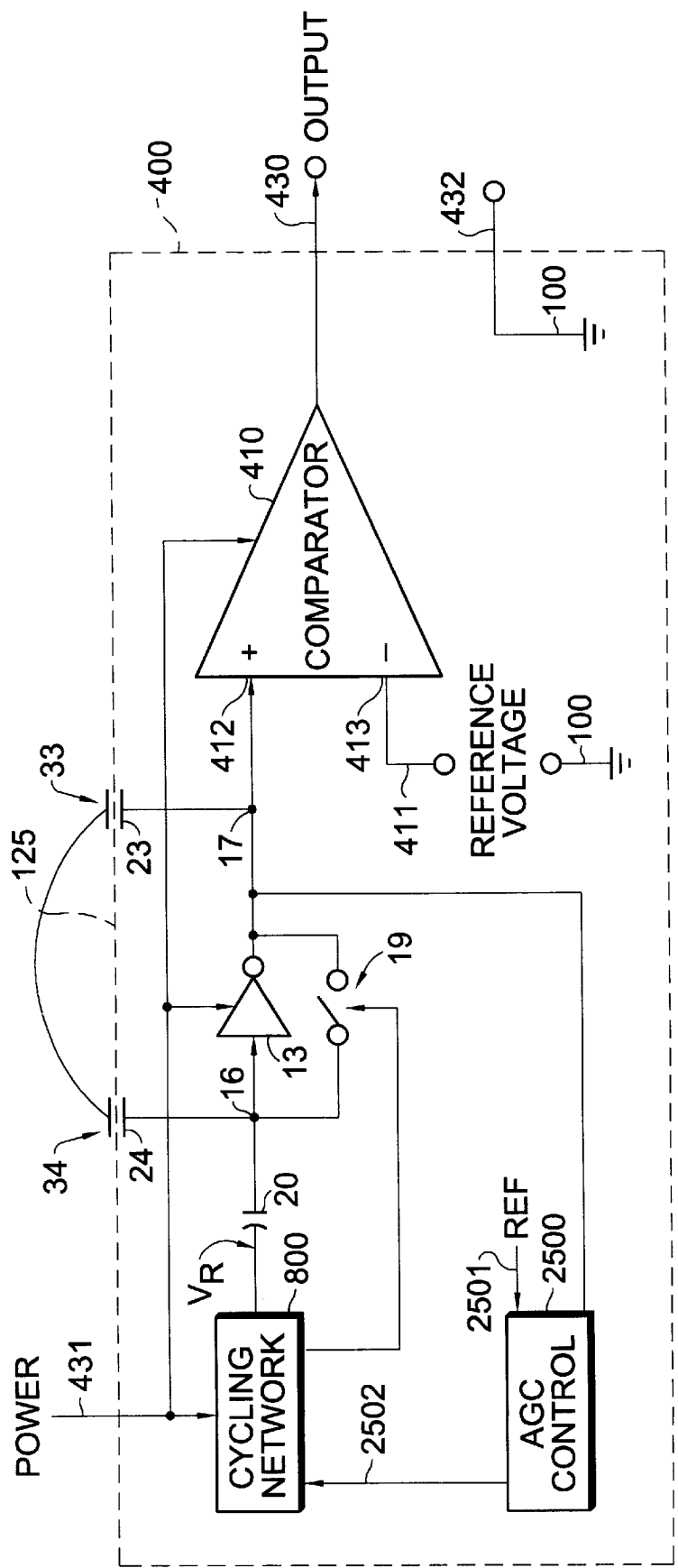
FIG. 8 is an embodiment of the invention wherein FIG. 4's solid state switch is modified by adding an AGC network to adjust the value of reference voltage Vr during quiescent times during which the switch is not operating, thereby allowing the switch to adapt to various ambient conditions by way of this voltage adjustment.

FIG. 8 shows an embodiment of the invention wherein FIG. 4's solid state switch 400 is modified by adding an AGC 2500 to adjust the value of reference voltage Vr during quiescent times during which switch 400 is not operating, thereby allowing switch 400 to adapt to various ambient conditions by way of this voltage adjustment.

Again, solid state switch 400 includes a signal comparator network 410 that operates to compare DC signal output 17 of amplifier 13 to a ground-referenced source of DC reference voltage 411, it being remembered that the magnitude of amplifier output 17 is indicative of the presence/absence of an ungrounded fingertip 18 on surface 125, generally vertically over the location of capacitor plates 23,24. That is, the variable magnitude of object-sensitive output signal 17 is compared to the constant magnitude of reference voltage 411.

Without limitation thereto, this FIG. 8 embodiment of the invention provides a momentary solid state switch 400. However, within the spirit and scope of this invention, the concepts found in FIG.8 may also be applied to a latched switch such as shown in FIG. 5.

This FIG. 8 embodiment of the invention provides a phase of operation wherein the magnitude of voltage Vr, that is the output of cycling network 800, is evaluated, this evaluation phase taking place during times of little use of solid state switch 400. That is, this evaluation phase takes place when switch 400 is not actively sensing a finger tip or object on surface 125; i.e., when no person or machine is trying to use switch 400.

In this mode of operation, AGC 2500 operates to compare output 17 of amplifier 13 with a reference voltage 2501 that defines an acceptable range of output 17 for amplifier 13 when switch 400 is not active; i.e., when output conductor 430 is not shorted to ground potential 100. As a result of the comparison of voltage 17 to voltage 2501, AGC 2500 operates to control cycling network 800 in a manner to adjust the magnitude of voltage Vr such that the resulting new output 17 of amplifier 13 is within the acceptable range that is established by reference voltage 2501.

In a preferred manner, AGC 2500 operates to first record a first-magnitude of amplifier output voltage 17 when switch 400 is not in use, and when cycling network is being controlled by a current-setting of cycling network 800 by a given magnitude control voltage 2502. Then, as a second step, AGC 2500 operates to apply a relative lower control voltage 2502 to cycling network 800, and to record the resulting second-magnitude of output voltage 17. Then, as a third step, AGC 2500 operates to apply a relative higher control voltage 2502 to cycling network 800, and to record the resulting third-magnitude of output voltage 17. A comparison of these three values of output voltage 17 is then made to ensure that the first-magnitude of output voltage 17 lies generally midway between the second-magnitude and the third-magnitude of output voltage 17. If not, then AGC 2502 operates to adjust cycling network 800 and its output voltage Vr by adjusting the above-stated current-magnitude of control voltage 2502.

In this manner, the quiescent operating point of the FIG. 8 solid state switch is periodically adjusted to accommodate changes in environmental conditions, such as temperature and humidity.

Figure 9:
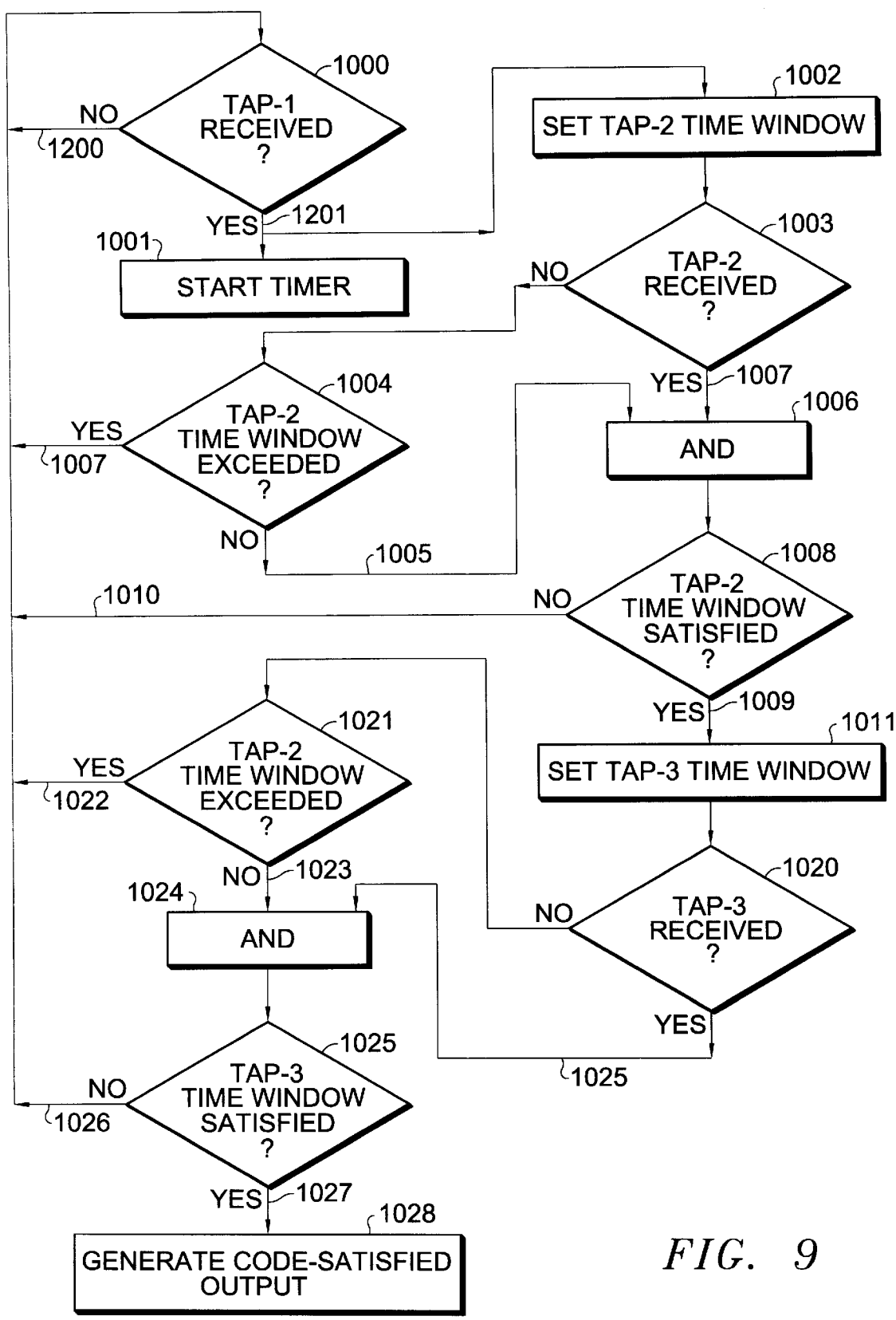
FIG. 9 shows an embodiment of this invention that uses the FIG. 4 switch as a temporal tap-code detector.
Figure 10:
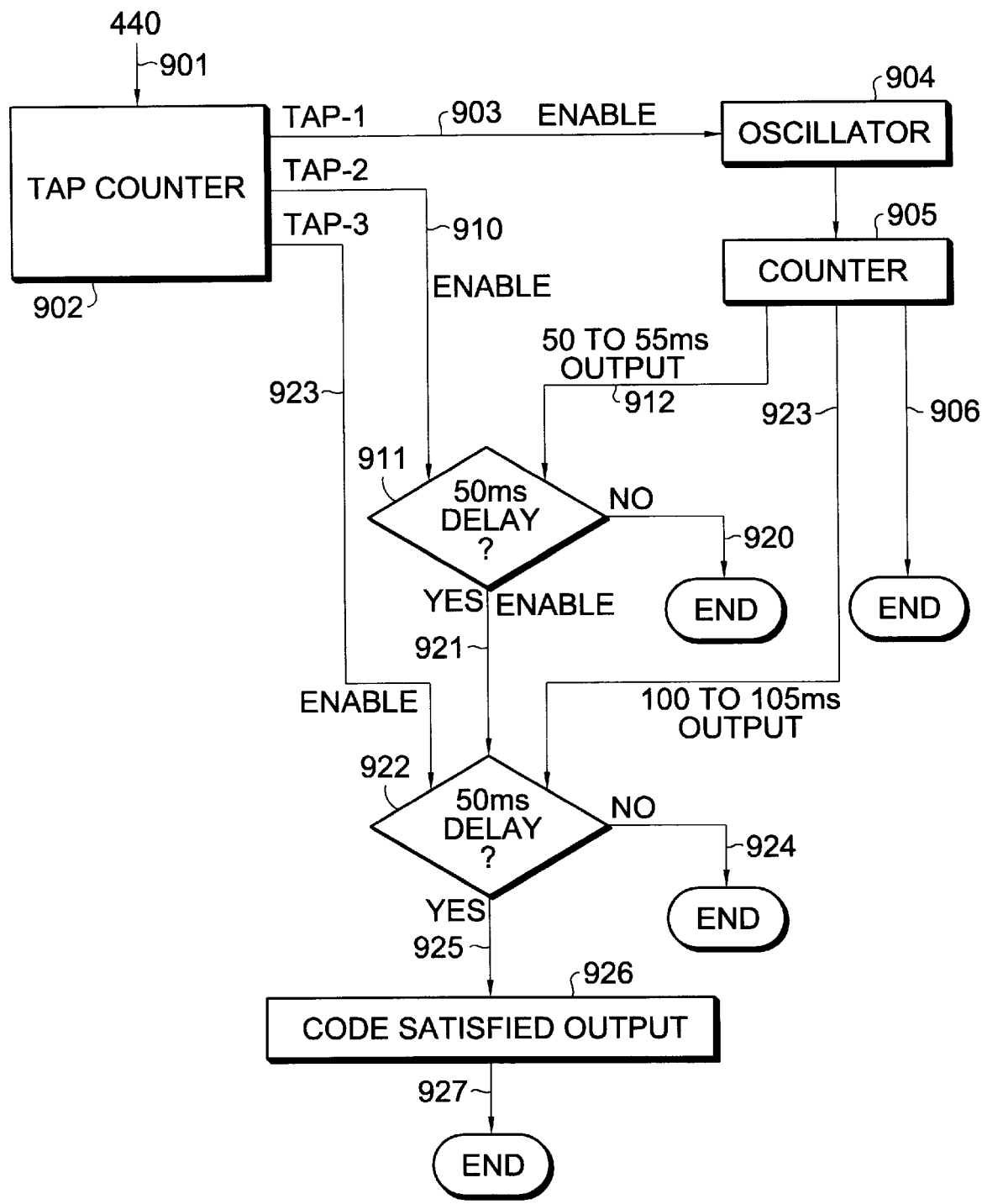
FIG. 10 shows another embodiment of this invention that uses the FIG. 4 switch as a temporal tap-code detector.

As described above relative to FIG. 4, momentary solid state switches 400 provides an output 430 by shorting output lead 430 to ground 432 when switch 400 is closed or turned on by the presence of fingertip 18 on surface 125, and switch 400 remains in this closed/on state only so long a fingertip 18 remains on surface 125. FIGS. 9 and 10 show embodiments of this invention that use the FIG. 4 momentary switch 400 as a temporal tap-code detector.

In this FIG. 9–10 arrangement, tapping on FIG. 4's switch surface 125 with a time-sequence of N-taps (that is, a number of taps that are punctuated by different time delays), operates to provide a code-satisfied-output that responds only to a specific predefined coded temporal sequence.

With reference to FIG. 9, with the apparatus as shown in a start condition, decision function 1000 is generating "no" output 1200, as function 1000 awaits the first tap (tap-1) of a tap/time code sequence on surface 125 of the FIG. 4 switch.

When tap-1 is received, function 1000 generates "yes" output 1201, and output 1201 starts a timer at function 1001, and sets the upper and lower time extremes of a tap-2-time-window at function 1002, for example a tap-2-time-window that extends from 50 to 55 milliseconds of timer 1001.

Decision function 1003 now awaits tap-2 on surface 125 of the FIG. 4 switch.

As long as the tap-2 has not been received, decision function 1004 is enabled to monitor timer 1001 to ensure that the upper extreme of tap-2-time-window 1002 is not exceeded. So long as this time window is not exceeded, "no" output 1005 provides a first enable input to AND function 1006.

If, however, tap-2-time-window 1002 is exceeded before tap-2 is actually received on surface 125 of the FIG. 4 switch, then "yes" output 1007 operates to reset the apparatus to its start condition.

Assuming, however, that tap-2 is received before the upper time extreme of the tap-2-time-window is reached by timer 1001, then "yes" output 1007 from decision function 1003 fully enables AND 1006. Decision function 1008 now determines if tap-2 occurred within the tap-2-time-window. If "yes", output 1009 operates to enable function 1011 to set the upper and lower time limits of a tap-3-time window.

However, should tap-2 be received earlier than the lower time limit of tap-2-time-window 1002, then "no" output 1010 operates to reset the apparatus to its start condition.

Decision function 1020 now operates to monitor for a tap-3 being applied to surface 125 of the FIG. 4 switch. So long as tap-3 is not detected, the "no" output of decision function 1020 enables a decision function 1021 to monitor timer 1001 to ensure that the upper limit of tap-3-time-window 1011 is not exceeded. If it is, "yes" output 1022 operates to reset the apparatus to its start condition, and so long as it is not, "no" output 1023 provides a first enable input to AND 1024.

Assuming that tap-3 is detected before tap-3 -time-window 1011 expires, then "yes" output 1025 of decision function 1020 operates to fully enable AND 1024, and decision function 1025 is thereby enabled to determine if tap-3 was received within the tap-3-time-window established by function 1011. If "no" output 1026 is generated, the apparatus is reset to its start condition. If "yes" output 1027 is generated, then function 1028 is enabled to generate a code-satisfied output, and the apparatus is reset to its start condition.

With reference to FIG. 10, switch 400 of FIG. 4 is provided with circuitry that includes an oscillator 904 and counter logic 905 in order to provide the FIG. 10 circuit arrangement that is operable to determine whether or not a received fingertip tap sequence matches a coded sequence that is stored in the circuit arrangement.

An example three-tap code that comprises the six following sequential time events; (1) tap-1, (2) a first 50 millisecond delay, (3) tap-2, (4) a second 50 millisecond delay, (5) tap-3 (6) tap code satisfied, will now be described relative to FIG. 9.

The tap-output 430 of the FIG. 4 switch 400 is shown entering the top of FIG. 10 at conductor 901. When the first tap output 901 is received, tap counter 902 increments to provide a "tap-1" output 903. Output 903 now enables oscillator 904, and counter logic 905 begins counting time intervals.

In the event that no other tap-outputs 901 are received, counter logic 905 times-out and timer output 906 operates to end the procedure, whereupon the FIG. 10 circuit arrangement is reset to its start condition.

Assuming that a second tap-output 901 occurs prior to reset output 906 occurring, then tap counter 902 increments to provide "tap-2" output 910. This event 910 enables decision network 911. Network 911 now interrogates counter output 912 to determine if a signal is present at output 912. In this example, output 912 is structured to be present only for the short time 5 millisecond time interval that extends from 50 milliseconds to 55 milliseconds after the time of enablement of oscillator 904 by tap counter output 903.

If a "no" output 920 occurs, it is known that the tap-sequence-code has not been satisfied, and the FIG. 10 circuit arrangement is reset to a start condition. If a "yes" output 921 occurs, then decision network 922 is partially enabled.

Subsequently, when "tap-3" output 923 occurs from tap counter 902 (again prior to reset output 906 occurring) decision network 922 is fully enabled.

Decision network 922 now interrogates output 923 of counter logic 905 to determine if a signal is present at output 923. In this example, output 923 is structured to be present only for the short time 5 millisecond time interval that extends from 100 milliseconds to 105 milliseconds after the time of enablement of oscillator 904 by tap counter output 903.

If a "no" output 924 occurs, it is known that the tap-sequence-code has not been satisfied, and the FIG. 10 circuit arrangement is reset to a start condition. If a "yes" output 925 occurs, then network 926 is enabled to provide an output indicating that the tap code has been satisfied, whereupon the FIG. 10 circuit arrangement is reset to a start condition as indicated at 927.

While this invention has been described in detail while making reference to various preferred embodiments, it is known that those skilled in the art will, upon learning of this invention, readily visualize yet other embodiments that are within the spirit and scope of this invention. Thus, the forgoing detailed description is not to be taken as a limitation on the spirit and scope of this invention.

What is claimed is:

1. A momentary switch, comprising:

a dielectric layer having an exposed surface;

an amplifier having an ungrounded input node and an ungrounded output node;

first and a second capacitor plates covered by a thin layer of said dielectric layer to place said exposed surface within an electric field-influence of said first and second capacitor plates, said first capacitor plate being connected to said input node and said second capacitor being connected to said output node;

wherein a magnitude of a signal at said output node is responsive to a proximity of an ungrounded object to said exposed surface;

and a signal comparator for comparing a signal at said output node of said amplifier to a reference voltage.

2. The momentary switch of claim 1 wherein said amplifier is a signal inverting amplifier.

3. The momentary switch of claim 1 wherein said exposed surface, said first capacitor plate, and said second capacitor plate form a compound capacitor that is connected to provide negative feedback from said output node to said input node of said amplifier, a capacitance value of said compound capacitor being a function of a proximity of an ungrounded object to said exposed surface.

4. The momentary switch of claim 1 including an external lead for applying operating power to said amplifier and said signal comparator; a grounded output lead; and an ungrounded output lead connected to an output of said signal comparator.

5. The momentary switch of claim 4 wherein said signal comparator operates to short said ungrounded output lead to said grounded output lead when an ungrounded object is in a predetermined proximity to said exposed surface.

6. The momentary switch of claim 1 including:

a cyclically operable control to (1) short said output and input node of said amplifier and (2) apply a reference voltage to said input node, in repeating cycles;

said a cyclically operable control to render said amplifier sensitive to the presence of an ungrounded object on said exposed surface during periods of application of said reference voltage to said input node of said amplifier.

7. The momentary switch of claim 6 wherein:

said amplifier is a signal inverting amplifier, and said exposed surface, said first capacitor plate, and said second capacitor plate form a compound capacitor that is connected to provide negative feedback from said output node to said input node of said amplifier, a capacitance value of said compound capacitor being a function of a proximity of an ungrounded object to said exposed surface.

8. The momentary switch of claim 7 including an external lead for applying operating power to said amplifier, said signal comparator, and said cyclically operable control means; a grounded output lead; and an ungrounded output lead connected to an output of said signal comparator.

9. The momentary switch of claim 8 wherein said signal comparator shorts said ungrounded output lead to said grounded output lead when an ungrounded object is in the presence of said exposed surface.

10. The momentary switch of claim 1 wherein said dielectric layer comprises a silicon member, and including:

a thin film of electrically nonconducting plastic sealing said silicon member.

* * * * *